US008859373B2

(12) United States Patent
Huang et al.

(10) Patent No.: US 8,859,373 B2
(45) Date of Patent: Oct. 14, 2014

(54) HIGH VOLTAGE DEVICE AND MANUFACTURING METHOD THEREOF

(71) Applicants: Tsung-Yi Huang, Hsinchu (TW); Chien-Wei Chiu, Beigang Township (TW)

(72) Inventors: Tsung-Yi Huang, Hsinchu (TW); Chien-Wei Chiu, Beigang Township (TW)

(73) Assignee: Richtek Technology Corporation, R.O.C., Chupei, Hsin-Chu (TW)

( * ) Notice: Subject to any disclaimer, the term of this patent is extended or adjusted under 35 U.S.C. 154(b) by 48 days.

(21) Appl. No.: 14/056,613

(22) Filed: Oct. 17, 2013

(65) Prior Publication Data

US 2014/0045314 A1 Feb. 13, 2014

Related U.S. Application Data

(62) Division of application No. 13/276,111, filed on Oct. 18, 2011.

(51) Int. Cl.
| | |
|---|---|
| *H01L 29/66* | (2006.01) |
| *H01L 29/06* | (2006.01) |
| *H01L 29/78* | (2006.01) |
| *H01L 29/10* | (2006.01) |

(52) U.S. Cl.
CPC ...... *H01L 29/66681* (2013.01); *H01L 29/0623* (2013.01); *H01L 29/7813* (2013.01); *H01L 29/7835* (2013.01); *H01L 29/1083* (2013.01); *H01L 29/66659* (2013.01)
USPC ............ 438/286; 438/197; 257/341; 257/339

(58) Field of Classification Search
CPC ............ H01L 29/1095; H01L 29/7835; H01L 29/66659; H01L 29/8913; H01L 29/66691; H01L 29/7802
USPC ........... 257/339, 129, 131, 487; 438/197, 286
See application file for complete search history.

(56) References Cited

U.S. PATENT DOCUMENTS

| 6,091,111 A * | 7/2000 | Demirlioglu et al. ......... 257/344 |
| 2010/0006935 A1 * | 1/2010 | Huang et al. .................. 257/341 |

* cited by examiner

*Primary Examiner* — Tom Thomas
*Assistant Examiner* — John Bodnar
(74) *Attorney, Agent, or Firm* — Tung & Associates

(57) ABSTRACT

The present invention discloses a high voltage device and a manufacturing method thereof. The high voltage device is formed in a substrate. The high voltage device includes: a gate, a source and drain, a drift region, and a mitigation region. The gate is formed on an upper surface of the substrate. The source and drain are located at both sides of the gate below the upper surface respectively, and the source and drain are separated by the gate. The drift region is located at least between the gate and the drain. The mitigation region is formed below the drift region, and the drift region has an edge closer to the source. A vertical distance between this edge of the drift region and the mitigation region is less than or equal to five times of a depth of the drift region.

3 Claims, 6 Drawing Sheets

HIGH VOLTAGE DEVICE AND MANUFACTURING METHOD THEREOF

CROSS REFERENCE

The present application is a divisional application of U.S. Ser. No. 13/276,111, filed on Oct. 18, 2011.

BACKGROUND OF THE INVENTION

1. Field of Invention

The present invention relates to a high voltage device and a manufacturing method of a high voltage device; particularly, it relates to such device and manufacturing method wherein the breakdown voltage is increased.

2. Description of Related Art

FIG. 1A shows a cross-section view of a prior art double diffused drain metal oxide semiconductor (DDDMOS) device. As shown in FIG. 1A, the N-type DDDMOS device is formed in a P-type substrate 11, which includes a gate 13, an N-type drain 15, an N-type source 16, and an N-type drift region 18. The drain 15, the source 16, and the drift region 18 are formed by a lithography process and an ion implantation process, wherein the lithography process defines the implantation regions by a photoresist mask together with a self-alignment effect provided by all or part of the gate 13, and the ion implantation implants N-type impurities to the defined regions in the form of accelerated ions. The drain 15 and the source 16 are beneath the gate 13 and at different sides thereof respectively.

FIG. 1B shows a depletion contour map of a prior art DDDMOS device. When a positive voltage is applied to the drain, a depletion region is formed between the N-type drain 15 and the P-type substrate 11. The depletion contour 19a indicates the boundary of the depletion region, wherein the region outside the depletion contour 19a is neutral, and the region inside the depletion contour 19a is depleted. FIGS. 1C and 1D show simulated voltage contour maps when the N-type DDDMOS device is ON and OFF respectively. A higher density of the voltage contours indicates a lower breakdown voltage.

The DDDMOS device is a high voltage device designed for applications requiring higher operation voltages. However, if it is required for the DDDMOS device to be integrated with a low voltage device in one substrate, the high voltage device and the low voltage device should adopt the same manufacturing process steps with the same ion implantation parameters, and thus the flexibility of the ion implantation parameters for the DDDMOS device is limited; as a result, the DDDMOS device will have a lower breakdown voltage and therefore a limited application range. To increase the breakdown voltage of the DDDMOS device, additional manufacturing process steps are required, that is, an additional lithography process and an additional ion implantation process are required in order to provide different ion implantation parameters, but this increases the cost.

In view of above, to overcome the drawbacks in the prior art, the present invention proposes a high voltage device and a manufacturing method thereof which provide a higher breakdown voltage so that the high voltage device may have a broader application range, in which additional manufacturing process steps are not required and the device area is not increased, such that the high voltage device can be integrated with and a low voltage device and manufactured by common manufacturing process steps.

SUMMARY OF THE INVENTION

The first objective of the present invention is to provide a high voltage device.

The second objective of the present invention is to provide a manufacturing method of a high voltage device.

To achieve the objectives mentioned above, from one perspective, the present invention provides a high voltage device, which is formed in a substrate having an upper surface, the high voltage device including: a gate, which is formed on the upper surface of the substrate; a source and a drain, which are located at both sides of the gate below the upper surface respectively, and are separated by the gate from cross-section view; a drift region, which has a same conduction type with the drain, and is located at least between the gate and the drain; and a mitigation region, which has a same conduction type with the drain, and is formed below the drift region from cross-section view, wherein the drift region has an edge closer to the source, and a vertical distance between this edge of the drift region and the mitigation region is less than or equal to five times of a depth of the drift region.

From another perspective, the present invention provides a manufacturing method of a high device, including: providing a substrate, wherein the substrate has an upper surface; forming a drift region below the upper surface, and forming a mitigation region below the drift region; forming a gate on the upper surface of the substrate; and forming a source and a drain at both sides of the gate below the upper surface respectively, which are separated by the gate from cross-section view, wherein the drain and the gate are separated by the drift region; wherein the drift region, the mitigation region, the source and the drain have a same conductive type, and the drift region has an edge closer to the source, wherein a vertical distance between this edge of the drift region and the mitigation region is less than or equal to five times of a depth of the drift region.

In one embodiment of the high voltage device, the mitigation region preferably does not overlap the source from top view.

In yet another embodiment, the high voltage device is preferably an N-type double diffused drain metal oxide semiconductor (NDDMOS) device.

In yet another embodiment, the substrate further includes an epitaxial layer, and the mitigation layer is formed below the epitaxial layer.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 2A:
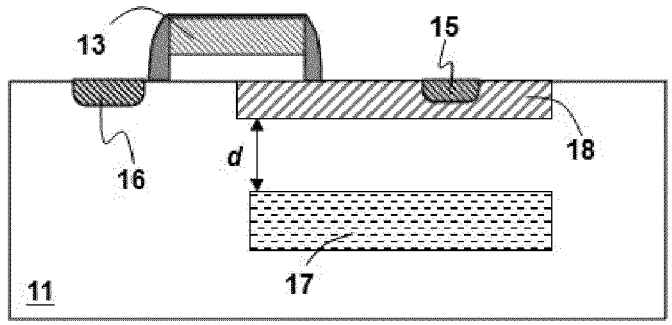
FIGS. 2A and 2B show a first embodiment of the present invention.
Figure 2B:
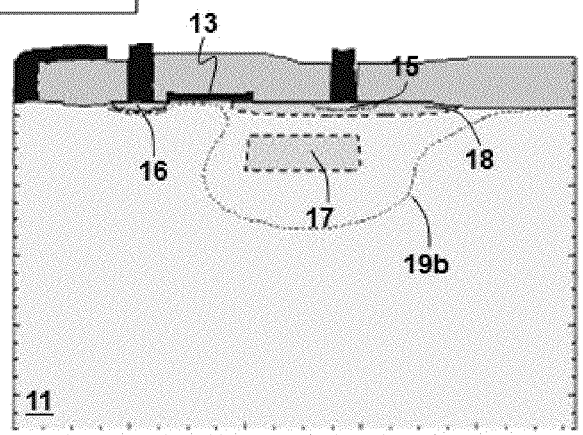

Please refer to FIGS. 2A and 2B for a first embodiment of the present invention, wherein a cross-section view of a DDDMOS device according to the present invention is illustrated in the figure. As shown in the figure, an N-type mitigation region 17 is formed below an upper surface of the P-type substrate 11. An N-type drift region 18 is formed in the substrate 11. A gate 13 is formed on the upper surface of the substrate 11, and an N-type drain 15 and an N-type source 16 are formed by a lithography process and an ion implantation process, wherein the lithography process defines the implantation regions by a photoresist mask together with a self-alignment effect provided by all or part of the gate 13, and the ion implantation implants N-type impurities in the form of accelerated ions. The drain 15 and the source 16 are beneath the gate 13 and at different sides thereof respectively from cross-section view; besides, the drain 15 and the gate 13 are separated by the N-type drift region 18. The N-type mitigation region 17 is formed below the N-type drift region 18 from cross-section view; the drift region 18 has an edge closer to the source 16, and a vertical distance d between this edge of the drift region 18 and the mitigation region 17 is less than or equal to five times of a depth of the drift region 18. Note that what is described is an NMOS device as an example; the high voltage DDDMOS device may be a PMOS device, and in this case the conductivities of the doped regions should be reversed, that is, the P-type regions should be replaced by N-type regions and the N-type regions should be replaced by P-type regions.

Figure 1A:
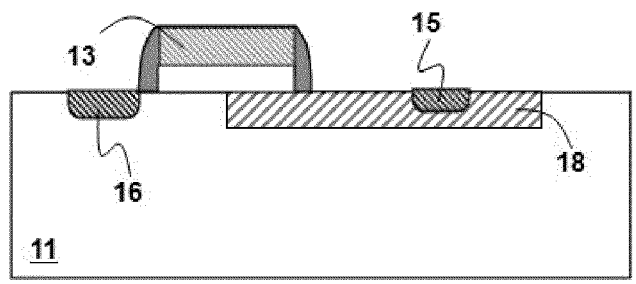
FIG. 1A shows a cross-section view of a conventional N-type DDDMOS device.
Figure 1B:
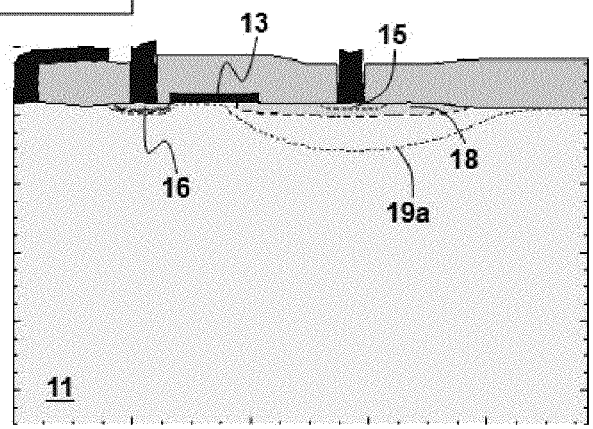
FIG. 1B shows a depletion contour map of a prior art N-type DDDMOS device.

FIG. 2B shows a depletion contour map of the N-type DDDMOS device of this embodiment. A positive voltage is applied to the N-type drain 15 and a depletion region is formed between the N-type drain 15 and the P-type substrate 11. A depletion contour 19b shown in the figure indicates the boundary of the depletion region. This depletion contour 19b is different from the depletion contour 19a of the prior art shown in FIG. 1B in that, in this embodiment, because the N-type mitigation region 17 is formed below the drift region 18, the depletion contour 19b is "wider" than the depletion contour 19a, such that the depletion contour 19b is more rounded and the depletion region is larger as compared with the depletion contour 19a, which indicates that the DDDMOS device of this embodiment has a lower electric field as compared with the prior art DDDMOS device under the same operation voltage, and therefore has a higher limit of the operation voltage and a higher breakdown voltage.

The vertical distance d is an important feature of the present invention. Referring to the cross-section view FIG. 2A, between the edge of the drift region 18 closer to the source 16 and the mitigation region 17, there is a P-type region having a depth (vertical distance) d which is less than or equal to five times of the depth of the drift region 18. A preferable embodiment of the vertical distance d is one to five times of the depth of the drift region 18, that is, the mitigation region 17 is distinguished from other N-type regions for other purposes. This arrangement has the following advantages: First, the high voltage device of the present invention has better characteristics because the present invention enhances the breakdown voltage of the high voltage device. Second, in manufacturing process, no additional process step or mask is required, that is, the structure can simply be formed by masking the area corresponding to the mitigation region 17 by a photoresist mask for forming the drift region 18, and implanting N-type impurities with a higher accelerated voltage below the drift region 18. As such, the high voltage device in the present invention has a better breakdown voltage while it can be manufactured by a low cost. However, the mask for forming the mitigation region 17 is not limited to using the mask for forming the drift region 18, but can be another mask.

Figure 3A:
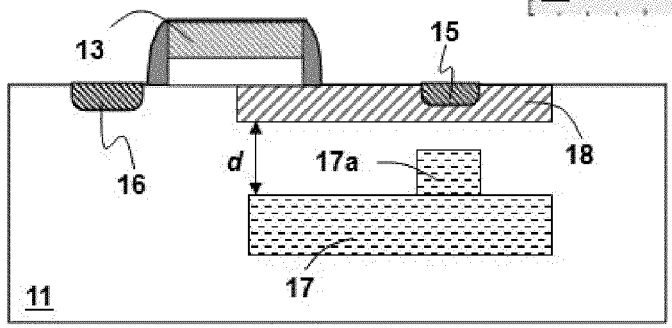
FIGS. 3A and 3B show a second embodiment of the present invention.
Figure 3B:
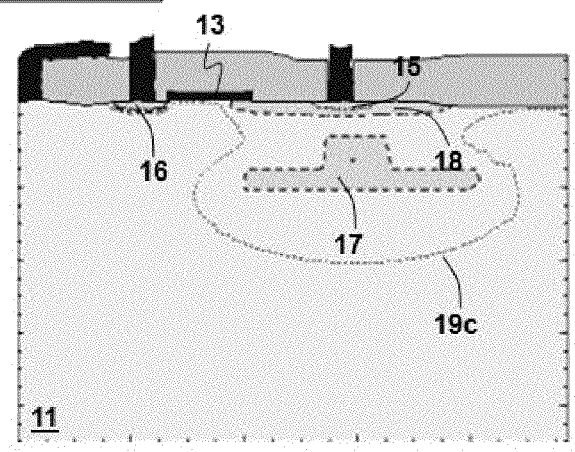

FIGS. 3A and 3B show a second embodiment of the present invention. This embodiment is different from the first embodiment in that, the mitigation region 17 of this embodiment further includes a sub-region 17a. This embodiment shows that there is no limitations to the size and shape of the mitigation region 17, and the sub-region 17a may even connect to the drift region 18 without impacting the function of the present invention, except that the vertical distance d between an edge of the drift region 18 and the mitigation region 17 should be less than or equal to five times of the depth of the drift region 18. FIG. 3B shows a depletion contour map of this embodiment. The depletion contour 19c shows that this embodiment according to the present invention can still increase the breakdown voltage as compared with the prior art with the depletion contour 19a.

Figure 1C:
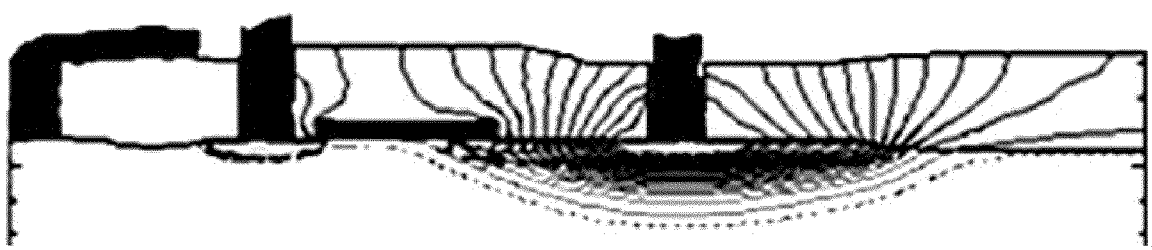
FIGS. 1C and 1D show simulated voltage contour maps when the N-type DDDMOS device is ON and OFF respectively.
Figure 4A:
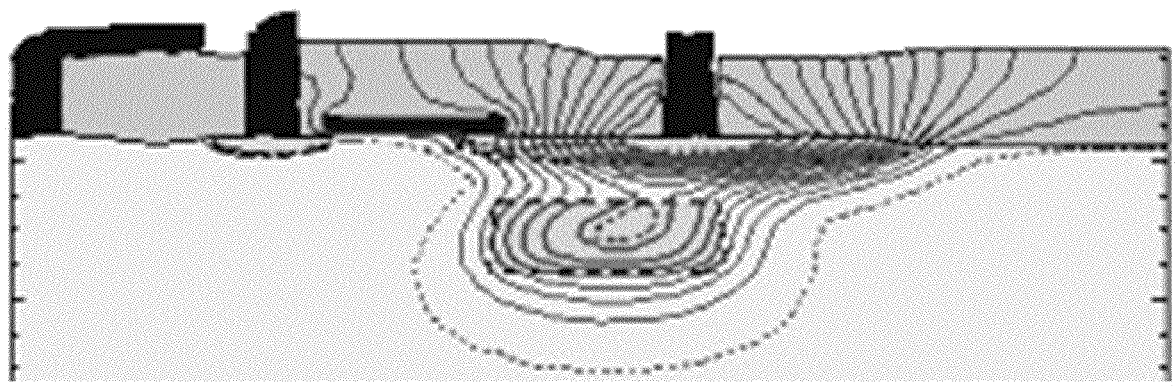
FIGS. 4A and 4B show simulated voltage contour maps of the first embodiment and second embodiment in the ON condition respectively.
Figure 4B:
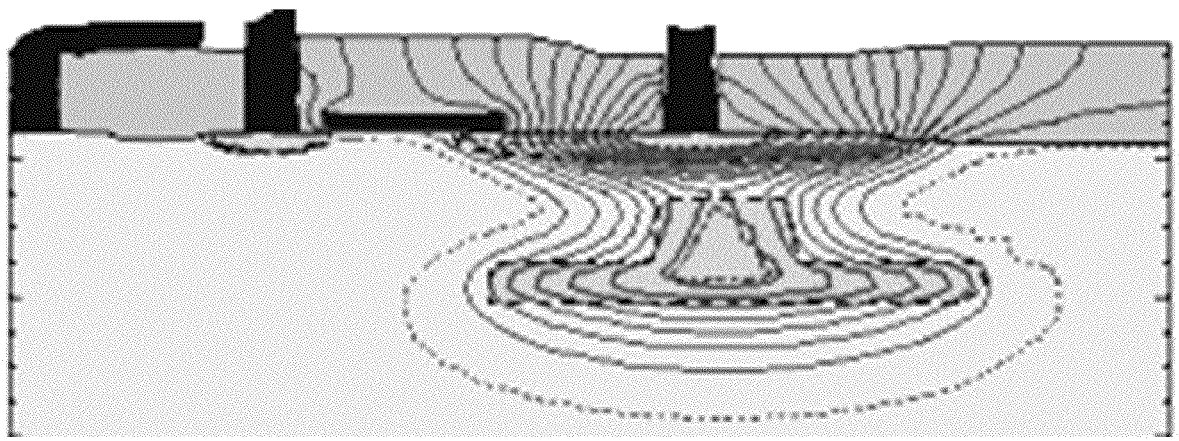
Figure 4C:
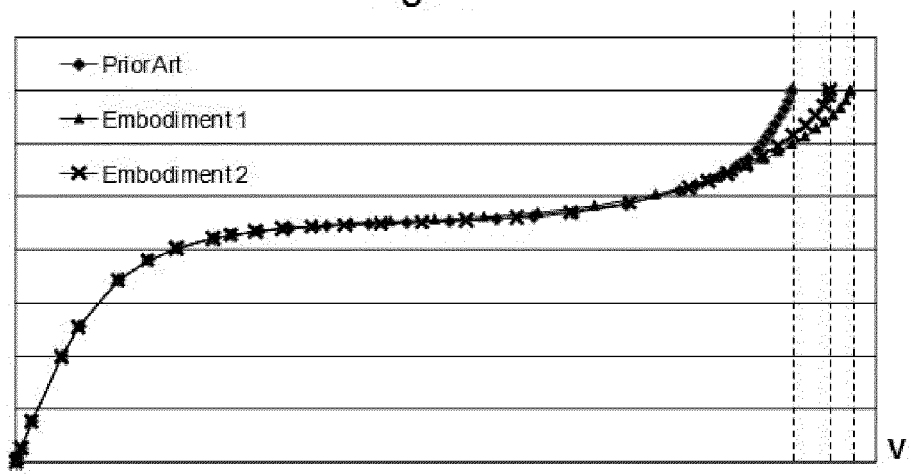
FIG. 4C shows comparison among these embodiments and prior art.

FIGS. 4A and 4B show simulated voltage contour maps of the first embodiment and second embodiment of the present invention in the ON condition respectively. The simulated voltage contour maps show how the breakdown voltage of the high voltage device in the present invention is enhanced as compared with the prior art. Comparing with FIG. 1C, the densities of the voltage contour maps of the first and second embodiments shown in FIGS. 4A and 4B are obviously lower than the density of the voltage contour map of the prior art shown in FIG. 1C. Under the same operation condition, i.e., the ON condition, the electric field of the present invention is lower compared with the prior art, such that the embodiments of the present invention can operate in higher voltage conditions. In other words, the breakdown voltage of the present invention is higher. FIG. 4C shows a comparison chart of the breakdown voltage of the three different devices of the prior art, the first and second embodiments of the present invention. The vertical dashed lines indicate ON breakdown voltages of the aforementioned devices. The comparison chart shows that the breakdown voltages of the embodiments of the present invention are higher than the prior art.

Figure 1D:
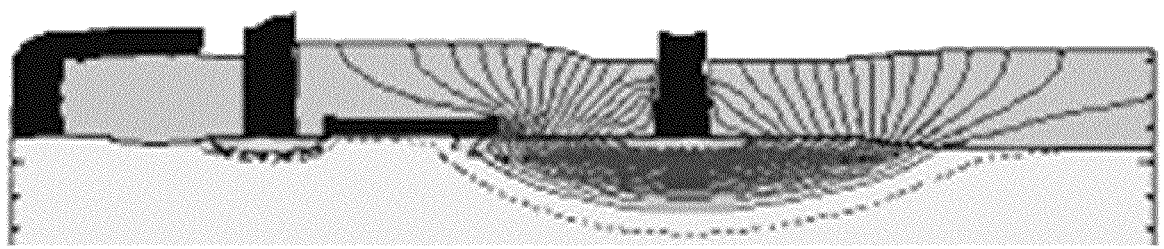
Figure 5A:
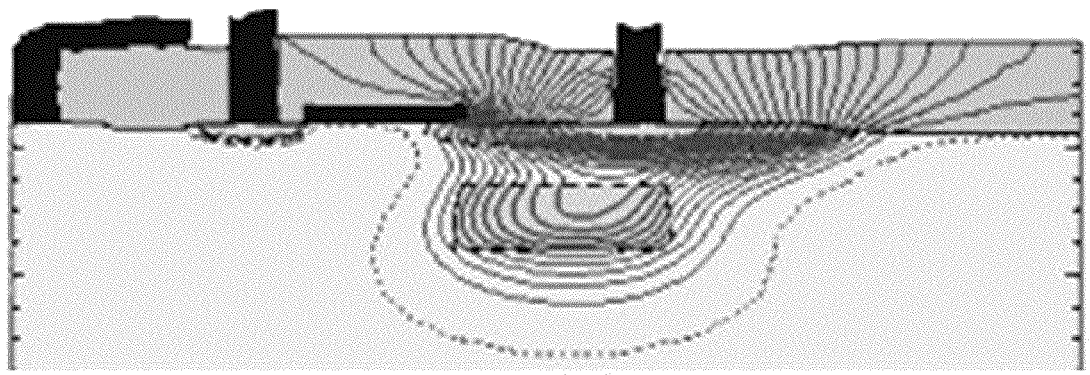
FIGS. 5A and 5B show simulated voltage contour maps of the first embodiment and second embodiment in the OFF condition respectively.
Figure 5B:
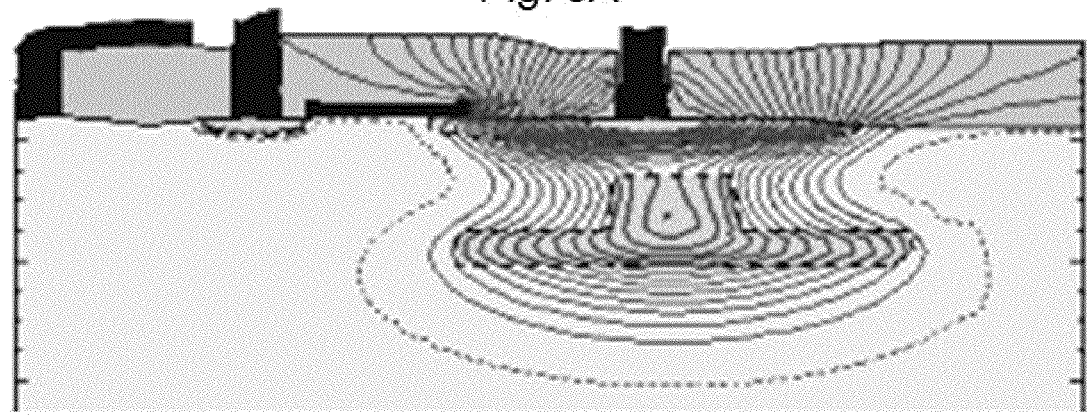
Figure 5C:
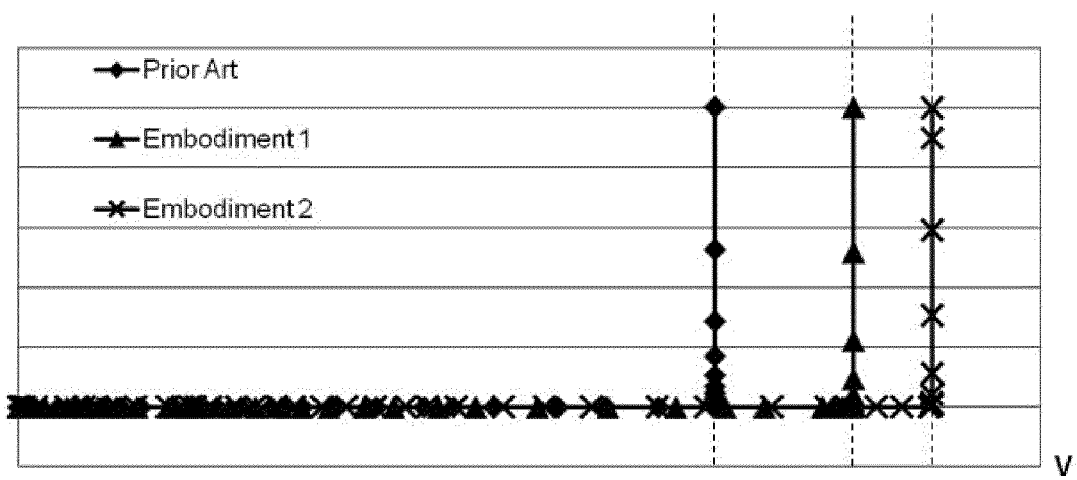
FIG. 5C shows comparison among these embodiments and prior art.

FIGS. 5A and 5B show simulated voltage contour maps of the first embodiment and second embodiment of the present invention in the OFF condition respectively. The simulated voltage contour maps show how the breakdown voltage of the high voltage device in the present invention is enhanced as compared with the prior art. Comparing with FIG. 1D, the densities of the voltage contour maps of the first and second embodiments shown in FIGS. 5A and 5B are obviously lower than the density of the voltage contour map of the prior art shown in FIG. 1D. Under the same operation condition, i.e., the OFF condition, the electric field of the present invention is lower compared with the prior art, such that the embodiments of the present invention can operate in higher voltage conditions. In other words, the breakdown voltage of the present invention is higher. FIG. 5C shows a comparison chart of the breakdown voltage of the three different devices of the prior art, the first and second embodiments of the present invention. The vertical dashed lines indicate OFF breakdown voltages of the aforementioned devices. The comparison chart shows that the breakdown voltages of the embodiments of the present invention are higher than the prior art.

Figure 6A:
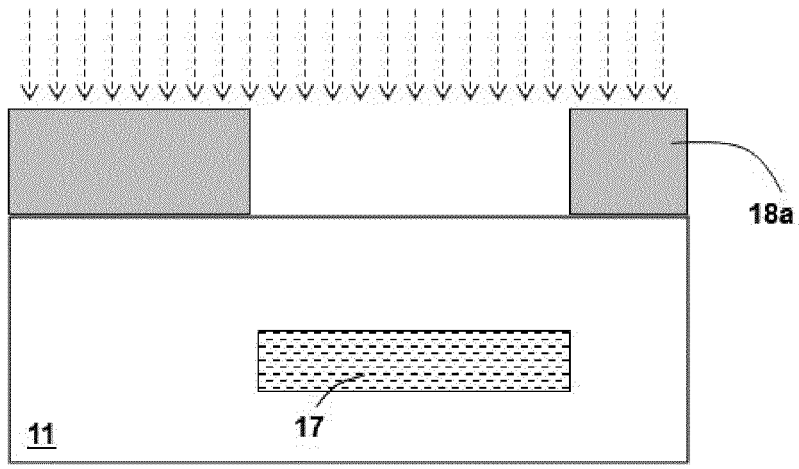
FIGS. 6A-6C and 7A-7B show a manufacturing method of a high voltage device of the present invention.

FIGS. 6A-6C and 7A-7B are examples illustrating manufacturing methods of the high voltage device of the present invention. As shown in FIG. 6A, first, a substrate 11 is provided, which has an upper surface; the substrate 11 is for example but not limited to a P-type substrate. Then the N-type mitigation region 17 is formed by a lithography process and an ion implantation process, wherein the lithography process defines the implantation regions by a photoresist mask 18a or some other type of mask, for example but not limited to the same mask by which the drift region 18 is formed, and the ion implantation implants N-type impurities to the defined regions in the form of accelerated ions.

Figure 6B:
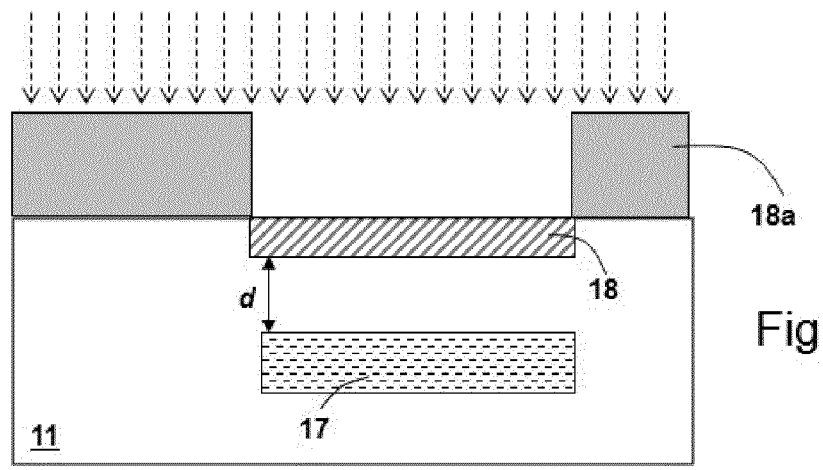

In the next, as shown in FIG. 6B, the N-type drift region 18 is formed by a lithography process and an ion implantation process, wherein the lithography process defines the implantation regions by a photoresist mask or some other type of mask, for example by the same photoresist mask 18a, and the ion implantation implants N-type impurities to the defined regions in the form of accelerated ions. It should be noted that, comparing with the drift region 18, the mitigation region 17 is formed in a deeper region in the substrate 11 by N-type impurities implanted in the form of higher voltage accelerated ions. Also please note that the sequence of the ion implantation process steps of the mitigation region 17 and the drift region 18 is not limited, i.e., the order of the ion implantation process steps of the mitigation region 17 and the drift region 18 is interchangeable.

Figure 6C:
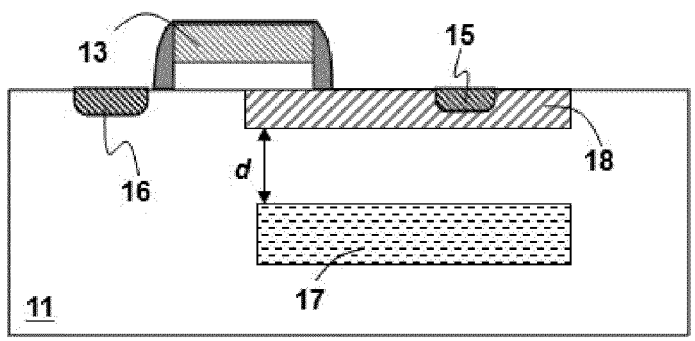

In the next, as shown in FIG. 6C, the gate 13 is formed on the upper surface of the substrate 11. The drain 15 and the source 16 are formed in the substrate 11 at both sides of the gate 13 below the upper surface respectively, which are separated by the gate 13 from cross-section view FIG. 6C, wherein the drain 15 and the gate 13 are separated by the drift region 18. Note that the drift region 18 has an edge closer to the source 16, wherein the vertical distance d between this edge of the drift region 18 and the mitigation region 17 is less than or equal to five times of a depth of the drift region 18. And preferably, the mitigation region 17 does not overlap the source 16 from top view (not shown).

Figure 7A:
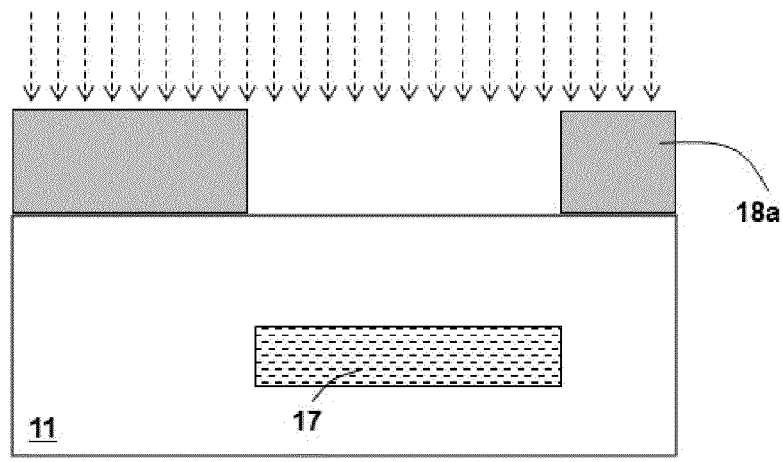
Figure 7B:
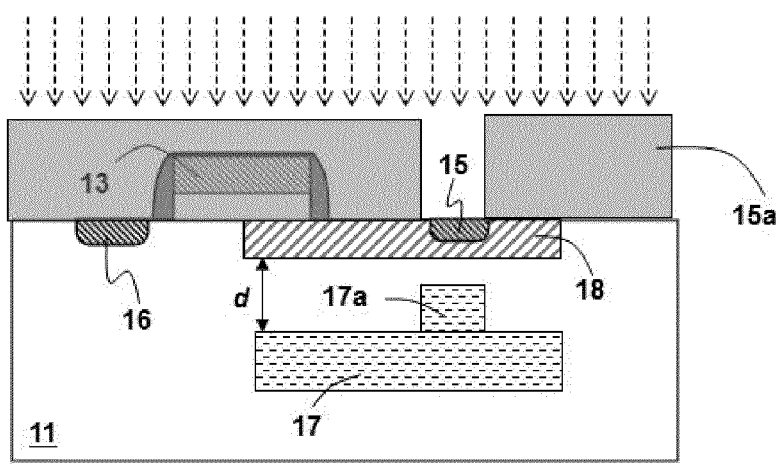

FIGS. 7A and 7B show another embodiment of the manufacturing method of the high voltage device of the present invention. This embodiment is different from the aforementioned embodiment shown in FIGS. 6A-6C in that, in this embodiment, the mitigation region 17 further includes a sub-region 17a. As shown in FIG. 7B, the N-type sub-region 17a can be formed by, for example but not limited to, a lithography process and an ion implantation process wherein the lithography process defines the implantation regions by a photoresist mask 15a or some other type of mask, for example but not limited to the same mask by which the drain region 15 is formed, and the ion implantation implants N-type impurities to the defined regions in the form of accelerated ions. Similar to the relationship between the mitigation region 17 and the drift region 18, the sub-region 17a is formed in a deeper region in the substrate 11 by N-type impurities implanted in the form of higher voltage accelerated ions as compared with the drain 15.

Note that the P-type substrate 11 described in the above embodiments can be, but is not necessarily a P-type bare substrate, that is, a substrate 11 formed by a P-type wafer. In other embodiments, the P-type substrate 11 may be a P-type epitaxial layer, formed by epitaxial growth, and the N-type mitigation region 17 may be formed below the epitaxial layer, for example but not limited to being formed before the epitaxial layer is formed.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above can be replaced by electron beam lithography, X-ray lithography, etc. For yet another example, although the mitigation region 17 and the sub-region 17a are preferably formed by the same photoresist masks for forming the drift region 18 and the drain 15 respectively, they may be formed by other masks. For another example, as described in the first embodiment and applicable to all other embodiments, the high voltage device according to the present invention may be a PMOS device, and in this case the conductivities of the doped regions should be reversed, that is, the P-type regions should be replaced by N-type regions and the N-type regions should be replaced by P-type regions. In view of the foregoing, the spirit of the present invention should cover all such and other modifications and variations, which should be interpreted to fall within the scope of the following claims and their equivalents.

What is claimed is:

1. A manufacturing method of a high voltage device, comprising:
   providing a substrate, wherein the substrate has an upper surface;
   forming a drift region below the upper surface, and forming a mitigation region below the drift region, wherein the drift region and the mitigation region are defined by one same lithography mask;
   forming a gate on the upper surface of the substrate after the drift region and the mitigation region are formed; and
   forming a source and a drain at both sides of the gate below the upper surface respectively, which are separated by the gate, wherein the drain and the gate are separated by the drift region;
   wherein the drift region, the mitigation region, the source and the drain have a same conductive type, and the drift region has a side closer to the source than other portions of the drift region, wherein a vertical distance between a lowest surface of this side of the drift region and the mitigation region is one to five times of a depth of the drift region, and wherein the mitigation region does not extend underneath the source.

2. The manufacturing method of claim 1, wherein the high voltage device is an N-type double diffused drain metal oxide semiconductor (NDDMOS) device.

3. The manufacturing method of claim 1, wherein the substrate further includes an epitaxial layer, and the mitigation layer is formed below the epitaxial layer.

* * * * *